United States Patent
Miyata et al.

(10) Patent No.: US 8,921,458 B2
(45) Date of Patent: Dec. 30, 2014

(54) RESIN COMPOSITION, MOLDED OBJECT AND SUBSTRATE MATERIAL BOTH OBTAINED FROM THE RESIN COMPOSITION, AND CIRCUIT BOARD INCLUDING THE SUBSTRATE MATERIAL

(75) Inventors: Kenji Miyata, Gunma (JP); Toshitaka Yamagata, Gunma (JP)

(73) Assignee: Denki Kagaku Kogyo Kabushiki Kaisha, Tokyo (JP)

(*) Notice: Subject to any disclaimer, the term of this patent is extended or adjusted under 35 U.S.C. 154(b) by 0 days.

(21) Appl. No.: 13/816,644

(22) PCT Filed: Aug. 26, 2010

(86) PCT No.: PCT/JP2010/064437
§ 371 (c)(1),
(2), (4) Date: Feb. 12, 2013

(87) PCT Pub. No.: WO2012/026012
PCT Pub. Date: Mar. 1, 2012

(65) Prior Publication Data
US 2013/0143981 A1   Jun. 6, 2013

(51) Int. Cl.
| | | |
|---|---|---|
| C08K 3/38 | (2006.01) | |
| C08G 59/24 | (2006.01) | |
| C08L 63/00 | (2006.01) | |
| H05K 1/03 | (2006.01) | |
| H05K 3/02 | (2006.01) | |

(52) U.S. Cl.
CPC ............... *C08K 3/38* (2013.01); *C08G 59/245* (2013.01); *C08L 63/00* (2013.01); *H05K 1/0373* (2013.01); *H05K 2201/0209* (2013.01); *H05K 2201/09118* (2013.01); *H05K 3/022* (2013.01)
USPC .......................................... 523/220; 524/404

(58) Field of Classification Search
CPC ........ C08G 59/245; C08K 3/38; C08L 63/00; H05K 1/0373
USPC .......................................... 523/220; 524/404
See application file for complete search history.

(56) References Cited

U.S. PATENT DOCUMENTS

2009/0104429 A1   4/2009   Goto et al.
2010/0291371 A1*  11/2010  Kanakarajan et al. ........ 428/323

FOREIGN PATENT DOCUMENTS

| JP | 2000-108220 A | 4/2000 |
|---|---|---|
| JP | 2002-012653 A | 1/2002 |
| JP | 2004-256687 A | 9/2004 |
| JP | 2007-224269 A | 9/2007 |
| JP | 2008-050526 A | 3/2008 |
| JP | 2008-280436 A | 11/2008 |
| JP | 2009-094110 A | 4/2009 |
| JP | 2009-138075 A | 6/2009 |
| WO | 2007-032424 A1 | 3/2007 |

OTHER PUBLICATIONS

International Search Report of PCT/JP2010/064437 dated Nov. 16, 2010.
Material Safety Data Sheet Version 12 by Denki Kagaku Kogyo Kabshiki Kaisya in Japanese (with Material Safety Data Sheet Version 14 in English).

* cited by examiner

*Primary Examiner* — Edward Cain
(74) *Attorney, Agent, or Firm* — Roberts Mlotkowski Safran & Cole P.C.

(57) ABSTRACT

To provide a resin composition having excellent thermal conductivity and excellent insulation reliability, a molded object, a substrate material, and a circuit board. [Solution] Provided is a resin composition which comprises an epoxy resin, a hardener, and an inorganic filler, wherein the epoxy resin and/or the hardener has a naphthalene structure, the inorganic filler comprises hexagonal boron nitride, and the inorganic filler accounts for 50-85 vol. % of the whole resin composition. Since a naphthalene structure, which imparts the satisfactory ability to wet the hexagonal boron nitride included in the inorganic filler, has been introduced into the epoxy resin and/or the hardener to heighten the inorganic-filler loading characteristics, this resin composition attains excellent heat dissipation properties, heat resistance, insulating properties, etc.

14 Claims, No Drawings

RESIN COMPOSITION, MOLDED OBJECT AND SUBSTRATE MATERIAL BOTH OBTAINED FROM THE RESIN COMPOSITION, AND CIRCUIT BOARD INCLUDING THE SUBSTRATE MATERIAL

TECHNICAL FIELD

The present invention relates to a resin composition superior in heat conductivity, a molded object and a substrate material both obtained from the resin composition, and a circuit board including the substrate material.

BACKGROUND ART

A heat-releasing component and a method of producing the heat-releasing component are proposed in Patent Document 1.

One of the heat-releasing compositions used in circuit boards is an epoxy resin containing high-heat conductivity and low-dielectric constant hexagonal boron nitride blended and dispersed therein (Patent Documents 2 and 3).

CITATION LIST

Patent Documents

[Patent Document 1] Japanese Unexamined Patent Application Publication No. 2009-094110
[Patent Document 2] Japanese Unexamined Patent Application Publication No. JP-A No. 2008-280436
[Patent Document 3] Japanese Unexamined Patent Application Publication No. JP-A No. 2008-050526

SUMMARY OF INVENTION

Technical Problem

For improvement of the heat-releasing efficiency and the heat resistance of resin compositions for heat release, it is desirable to increase the filling efficiency of inorganic filler such as hexagonal boron nitride. However, it was difficult to increase the filling efficiency of the inorganic filler, particularly in the case of heat-releasing resin compositions comprising an inorganic filler containing hexagonal boron nitride blended therein and, as a result, such resin compositions had insufficient heat-releasing efficiency and heat resistance and also insufficient insulation properties and moldability.

Accordingly, a main object of the present invention is to provide a heat-releasing resin composition comprising an inorganic filler containing hexagonal boron nitride, which is superior in the filling efficiency of the inorganic filler and also in heat-releasing efficiency, heat resistance, insulation properties, and moldability.

Solution to Problem

The present invention, which was made to solve the problems above, provides a resin composition comprising an epoxy resin, a curing agent and an inorganic filler, wherein: one or both of the epoxy resin and the curing agent contain a naphthalene structure; the inorganic filler contains hexagonal boron nitride; and the inorganic filler is contained in an amount of 50 to 85 vol % in the entire resin composition.

When an epoxy resin and/or a curing agent having a naphthalene structure that is favorably compatible with the hexagonal boron nitride contained in the inorganic filler is used in the resin composition, it is possible to raise the filling efficiency of the inorganic filler.

In the resin composition, preferably, the inorganic filler contains coarse particles having an average particle diameter of 10 to 400 μm and fine particles having an average particle diameter of 0.5 to 4.0 μm and the blending ratio of the coarse particles is 70% or more.

In the resin composition, the coarse particles and/or the fine particles are preferably particles of hexagonal boron nitride.

When the coarse particles are particles of hexagonal boron nitride, the particles of hexagonal boron nitride are more preferably particles in the shape of flat plate or the aggregate of flat plate-shaped particles, having a graphitization index (GI) value of 1.5 or less and having a particle tap density of 0.5 g/cm$^3$ or more. When the coarse particles are particles of hexagonal boron nitride, the fine particles may be spherical particles of aluminum oxide.

The present invention also provides
a molded object prepared by molding and curing a resin composition comprising an epoxy resin, a curing agent, and an inorganic filler, wherein one or both of the epoxy resin and the curing agent contain a naphthalene structure, the inorganic filler contains hexagonal boron nitride, and the inorganic filler is contained in an amount of 50 to 85 vol % in the entire resin composition and
a substrate material prepared by converting the resin composition into a sheet shape and converting the resulting sheet into the B stage state under heat.

Multiple sheets of the substrate material may be cut, as laminated, in the thickness direction, to give a new substrate material having a flattened cut-terminal face. The inorganic filler may be oriented in a certain direction in these substrate materials.

The present invention additionally provides a circuit board prepared by laminating a substrate material, which is obtained by molding into a sheet shape a resin composition, comprising an epoxy resin, a curing agent, and an inorganic filler, wherein one or both of the epoxy resin and the curing agent contain a naphthalene structure, the inorganic filler contains hexagonal boron nitride, and the inorganic filler is contained in an amount of 50 to 85 vol % in the entire resin composition and heating the sheet into the B stage, on a metal substrate, laminating a metal foil on the substrate material, and forming a circuit by locally removing the metal foil formed.

DESCRIPTION OF EMBODIMENTS

Hereinafter, favorable embodiment of the present invention will be described. The embodiment described below is a typical embodiment of the present invention and it should be understood that the scope of the present invention is not restricted by these embodiments. The description will be made in the following order.
1. Resin composition
(1) Epoxy resin
(2) Curing agent
(3) Inorganic filler
2. Molded object
3. Substrate material
4. Circuit board
1. Resin Composition
The resin composition according to the present invention is a resin composition comprising an epoxy resin, a curing agent, and an inorganic filler, wherein: one or both of the epoxy resin and the curing agent contain a naphthalene structure; the inorganic filler contains hexagonal boron nitride; and the inorganic filler is contained in an amount of 50 to 85 vol % in the entire resin composition.

(1) Epoxy Resin

The epoxy resin is an epoxy compound having two or more epoxy groups in the molecule, and an epoxy resin having a naphthalene structure skeleton, which is favorably compatible with the hexagonal boron nitride contained in the inorganic filler, is preferable for improvement of the filling efficiency of the inorganic filler. The blending amount of the epoxy resin is preferably 7.5 parts by mass or more and 33.0 parts by mass or less, more preferably 8.8 parts by mass or more and 31.7 parts by mass or less.

(2) Curing Agent

The curing agent is a curing agent of an epoxy resin, and typical examples thereof include those of phenolic novolak resins, acid anhydride resins, amino resins, and imidazoles. Among the curing agents above, those having a naphthalene structure skeleton are preferable for improvement of the filling efficiency of the inorganic filler. The blending amount of the curing agent is preferably 0.5 part by mass or more and 8.0 parts by mass or less, more preferably 0.9 part by mass or more and 6.55 parts by mass or less.

(3) Inorganic Filler

The inorganic filler is a compound added for improvement of heat conductivity and typical examples thereof include hexagonal boron nitride, aluminum oxide, magnesium oxide, boron nitride, aluminum nitride, silicon nitride, silicon carbide and the like. The inorganic filler preferably contains hexagonal boron nitride.

The content of the inorganic filler is 50 to 85 vol % in the entire volume. The content is particularly preferably 65 to 83 vol %. When the content of the inorganic filler is less than 50 vol %, the molded object has lower heat conductivity. Alternatively when it is more than 85 vol %, pores are easily formed during molding, unfavorably leading to deterioration in insulation properties and mechanical strength of the molded object.

The inorganic filler preferably contains coarse particles having an average particle diameter of 10 to 400 μm and fine particles having an average particle diameter of 0.5 to 4.0 μm. Use of coarse particles and fine particles in combination as the inorganic filler permits filling of fine particles between coarse particles, thus leading to improvement of the filling rate of the entire inorganic filler. When the inorganic filler contains both coarse and fine particles, the blending ratio of the coarse particles is preferably 70% or more, more preferably 75% or more. It is because, when the ratio of the coarse particles is lower, the resin composition may become less flowable, possibly prohibiting production of densely packed molded objects.

Even when coarse and fine particles are used in combination, the raw material for the particles is, for example, aluminum oxide, magnesium oxide, boron nitride, aluminum nitride, silicon nitride, or silicon carbide, and hexagonal boron nitride is preferable.

The coarse particles preferably have a graphitization index (GI) value of 1.5 or less. As shown in Formula (1), the GI value is the ratio of the area of 002 diffraction peak (Area (002)) to the area of 100 diffraction peak (Area (100)), as determined in X-ray diffraction analysis. When the GI value is lower, the particles are higher in crystallinity. Unfavorably when the crystallinity is low, the particles do not grow sufficiently, making the molded object less heat-conductive.

$$GI = Area(100)/Area(002) \quad (1)$$

The tap density of the coarse particles in the inorganic filler is preferably 0.5 g/cm$^3$ or more for improvement of the filling and dispersion efficiencies of the inorganic filler.

The tap density is bulk density of the filler and, as described in JIS Z2500 (2045), it is the mass of the particles per unit volume of a container under vibration.

The shape of the coarse particles in the inorganic filler is preferably individual flat platelet or the aggregate of flat platelet-shaped particles.

The fine particles in the inorganic filler are preferably particles of hexagonal boron nitride, because the particles give a low-dielectric constant, high-insulation, and high-heat conductivity cured resin. Spherical alumina is also favorable, as it gives high-insulation, high-heat conductivity cured resins.

The presence of a naphthalene structure, which is favorably compatible with the hexagonal boron nitride contained in the inorganic filler, in the epoxy resin and/or the curing agent of the resin composition according to the present invention increases the filling efficiency of the inorganic filler. Specifically, it permits filling of the inorganic filler in an amount of up to 50 to 85 vol % in the entire resin composition. As a result, the resin composition according to the present invention shows favorable heat-releasing efficiency, heat resistance, and insulation properties and also favorable moldability.

2. Molded Object

The molded object according to the present invention is a molded object obtained by molding and curing the resin composition described above.

During the molding, the resin composition is pressed from top and bottom under a pressure of 0.1 kgf/cm$^2$ or more. The resulting molded object shows high insulation properties and high heat conductivity and is characteristic in that it is favorably adhesive to metals such as aluminum, copper, and the alloys thereof. The molded object is favorable as a substrate for hybrid integrated circuits and also as an insulating layer for circuit boards. An extrusion molding machine or a vacuum hot press apparatus can be used for the molding.

3. Substrate Material

The substrate material according to the present invention is a substrate material obtained by molding the resin composition described above into a sheet shape and converting it into the B stage state under heat.

The B stage state is a state in which the resin composition is apparently dry at room temperature and melts again when heated at high temperature. More specifically, it is a state having a curing degree, as calculated from the heat generated during curing, which is determined by using a differential scanning calorimetry (DSC), of less than 70%. Alternatively, the C stage state is a state in which the resin composition is mostly cured. It is a state in which the molded object does not melt again even when heated at high temperature and a state having a curing degree of 70% or more.

The substrate material, which is in the B stage state, shows high heat conductivity.

Multiple sheets of the substrate material may be laminated and cut in the thickness direction into a new substrate material having a flattened cut-terminal face. It is possible in this way to change the direction of the heat release.

The inorganic filler blended in the resin composition constituting the substrate material in these substrates is preferably oriented in a certain direction. The orientation direction of the inorganic filler is responsible for the direction of the heat release in the substrate material, and thus, the direction of heat release in the substrate material can be controlled by alteration of the orientation direction of the inorganic filler.

Specifically when the molded object is obtained by extrusion molding, the inorganic filler orient itself in the extrusion direction. When multiple pieces of the substrate material after the extrusion molding are laminated and cut in the thickness direction into a substrate material having the cut surface as its plane, it is possible to make the orientation direction of the inorganic filler therein perpendicular to that of the inorganic filler in the substrate material after extrusion molding.

4. Circuit Board

The circuit board according to the present invention is a circuit board having a metal substrate, a substrate material described above laminated on the substrate, and a metal foil laminated on the substrate material and carrying a circuit prepared by locally removing the metal foil.

As described above, the resin composition according to the present invention, which is improved in the filling efficiency of inorganic filler, shows excellent heat-releasing efficiency, heat resistance, and insulation properties. Accordingly, the circuit board has favorable heat-releasing efficiency and heat resistance and additionally low dielectric constant and shows favorable insulation properties.

The material for the metal substrate is, for example, copper, aluminum, nickel, iron, tin, silver, titanium, gold, magnesium, silicon, or an alloy of these metals. The thickness of the substrate is, for example, 35 to 3000 μm.

The material for the metal foil is copper, aluminum, nickel, iron, tin, silver, titanium, gold, magnesium, silicon, or an alloy of these metals. The material may be plated with nickel or a nickel-gold alloy. The thickness of the metal foil is, for example, 4 to 300 μm.

The circuit board is prepared, for example, by laminating the resin composition described above on a metal substrate, curing the resin composition, laminating a metal foil thereon, integrating the composite by hot press under heat, and removing locally the metal foil, for example by etching, for preparation of a circuit.

EXAMPLES

Hereinafter, the present invention will be described in detail, based on Examples and Comparative Examples, with reference to "Tables 1 and 2."

TABLE 1

| Composition and evaluation/Example | 1 | 2 | 3 | 4 | 5 | 6 | 7 | 8 | 9 | 10 | 11 |
|---|---|---|---|---|---|---|---|---|---|---|---|
| Resin composition | | | | | | | | | | | |
| Epoxy resin/naphthalene type (parts by mass) | 31.7 | 16.7 | 10.5 | 8.8 | 10.5 | 10.5 | 9.8 | 16.7 | 8.8 | 7.7 | 4.5 |
| Curing agent (parts by mass) | | | | | | | | | | | |
| Imidazoles | 2.70 | 1.60 | 1.00 | 0.90 | 1.00 | 1.00 | 1.00 | 1.60 | 0.90 | 0.05 | 0.05 |
| Naphthalenetetracarboxylic dianhydride | — | — | — | — | — | — | — | — | — | 3.5 | — |
| Naphthol aralkyl-type phenol resin | — | — | — | — | — | — | — | — | — | — | 6.5 |
| Inorganic filler | | | | | | | | | | | |
| Coarse particles | | | | | | | | | | | |
| Material | BN | BN | BN | BN | BN | BN | BN | BN | BN | BN | BN |
| Shape | flat plate | flat plate | flat plate | flat plate | flat plate | flat plate | flat plate | aggregate | aggregate | flat plate | flat plate |
| Tap density (g/cm$^3$) | 0.8 | 0.8 | 0.8 | 0.8 | 0.8 | 0.8 | 0.8 | 1.0 | 1.0 | 0.8 | 0.8 |
| GI value | 0.6 | 0.6 | 0.6 | 0.6 | 0.6 | 0.6 | 0.6 | 1.1 | 1.1 | 0.6 | 0.6 |
| Average diameter (μm) | 23 | 23 | 23 | 23 | 23 | 23 | 23 | 300 | 300 | 23 | 23 |
| Blending amount (parts by mass) | 55.9 | 69.6 | 75.31 | 76.9 | 61.9 | 88.4 | 75.9 | 69.6 | 76.9 | 75.31 | 75.31 |
| Fine particles | | | | | | | | | | | |
| Material | BN | BN | BN | BN | BN | BN | Al$_2$O$_3$ | BN | BN | BN | BN |
| Shape | flat plate | flat plate | flat plate | flat plate | flat plate | flat plate | spherical | flat plate | flat plate | flat plate | flat plate |
| Average diameter (μm) | 2.2 | 2.2 | 2.2 | 2.2 | 2.2 | 2.2 | 0.5 | 2.2 | 2.2 | 2.2 | 2.2 |
| Blending amount (parts by mass) | 9.8 | 12.1 | 13.1 | 13.4 | 26.5 | 0 | 13.2 | 12.1 | 13.4 | 13.1 | 13.1 |
| Filling rate (vol %) | 50 | 70 | 80 | 83 | 80 | 80 | 80 | 70 | 83 | 80 | 80 |
| Coarse particles ratio (%) | 85 | 85 | 85 | 85 | 70 | 100 | 85 | 85 | 85 | 85 | 85 |
| Coupling agent (parts by mass) | 0.5 | 0.5 | 0.5 | 0.5 | 0.5 | 0.5 | 0.5 | 0.5 | 0.5 | 0.5 | 0.5 |
| Evaluation | | | | | | | | | | | |
| Heat resistance (° C.) | 406 | 421 | 435 | 440 | 434 | 435 | 430 | 419 | 438 | 415 | 445 |
| Heat conductivity (W/mK) | | | | | | | | | | | |
| Thickness direction | 10.5 | 22.1 | 34.2 | 42.1 | 29.2 | 37.2 | 28.2 | 16.5 | 21.1 | 28.7 | 28.0 |
| In-plane direction | 2.1 | 3.2 | 3.8 | 4.2 | 4.3 | 5.6 | 5.8 | 14.2 | 22.4 | 3.9 | 4.4 |
| Thermal diffusivity (m$^2$/sec) | 6.4 | 9.7 | 17.7 | 19.9 | 17.1 | 18.9 | 16.2 | 9.8 | 12.5 | 16.9 | 16.6 |
| Specific gravity (kg/m$^3$) | 1.71 | 1.92 | 2.03 | 2.04 | 2.03 | 2.03 | 2.12 | 1.91 | 2.01 | 2.02 | 2.01 |
| Specific heat (J/kgK) | 0.96 | 0.88 | 0.84 | 0.84 | 0.84 | 0.84 | 0.82 | 0.88 | 0.84 | 0.84 | 0.84 |
| Initial dielectric strength (kV/mm) | 45 | 40 | 38 | 30 | 32 | 36 | 32 | 35 | 30 | 25 | 24 |

Example 1

The resin composition of Example 1 is a resin composition at the blending rate shown in "Table 1." The epoxy resin used in the present Example was a naphthalene-type epoxy resin having a naphthalene structure (HP4032, produced by DIC Corporation); the curing agent used was imidazole (2E4MZ-CN, produced by Shikoku Chemicals Corporation), and the coupling agent used was a silane-coupling agent (Z-0640N, produced by Dow Corning Toray Co., Ltd.). The inorganic filler contained hexagonal boron nitride (described as BN in "Table 1").

The average particle diameter of the inorganic filler was determined by using a "laser-diffraction particle size distribution analyzer SALD-200," produced by Shimadzu Corporation. 50 cc of purified water and 5 g of the heat-conductive powder to be tested were placed as a sample in a glass beaker and agitated with a spatula, and the mixture was dispersed then in a ultrasonic cleaning machine for 10 minutes. The dispersion of the heat-conductive material particles was added dropwise from a dropper to the sampler unit of the device until the light absorbance thereof became measurable. After the light absorbance was stabilized, the test was carried out. In the laser-diffraction particle size distribution analyzer, the particle size distribution was calculated from the data on light intensity distribution of the diffraction/scattering light from the particles, as determined by a sensor. The average particle diameter was calculated by multiplying the diameter of the particles measured by the amount of the corresponding particles (difference %) and dividing the product by the total amount (100%) of the corresponding particles. The average particle diameter is the average diameter of the particles.

The effects were determined as the resin composition was molded into a sheet shape.

The resin composition of Example 1 was molded in an extrusion molding machine into thin plates having a thickness of 1.0 mm; the thin plates were heated for half curing at 120° C. for 15 minutes, as pressed from top and bottom under a pressure of 1.0 kgf/cm$^2$; and 50 resin composition sheets above in the half-cured state were laminated; and the laminate was integrated by heat treatment similar to that for half curing and cut in the thickness direction, to give a substrate material having a flattened cut-terminal face.

Evaluation results of the substrate materials obtained by the production method above are shown in "Table 1." Hereinafter, each evaluation method will be described.

The heat conductivity, an advantageous effect of the present invention, was evaluated by heat resistance and heat conductivity. The insulation reliability, another advantageous effect of the present invention, was evaluated by initial dielectric strength.

(Heat Resistance)

20 mg of a resin composition of Example was placed in a platinum container; the thermal weight loss of the sample was determined during the period from 25° C. to 1000° C. when it was heated at a heating rate of 10° C./min; and the temperature at a weight-loss rate of 5 wt % was determined. The analyzer used was TG-DTA (ThermoPlus Evo TG8120, produced by Rigaku Corporation). The heat resistance should be 350° C. or more.

(Heat Conductivity)

<Heat Conductivity in Thickness Direction>

The heat conductivity in the thickness direction was calculated by multiplying the thermal diffusivity, the specific gravity, and the specific heat of the resin composition of Example. The thermal diffusivity was determined by laser flash method, after the sample was processed into a test sample of 10 mm width×10 mm×1 mm thickness. The analyzer used was a xenon flash analyzer (LFA447 NanoFlash, produced by NETZSCH). The specific gravity was determined by the Archimedes's method. The specific heat was determined by using DSC (ThermoPlus Evo DSC8230, produced by Rigaku Corporation). The heat conductivity in the thickness direction should be 2.0 (W/mK) or more.

<Heat Conductivity in in-Pane Direction>

The heat conductivity in the in-plane direction is calculated similarly from the product of the thermal diffusivity, the specific gravity and the specific heat capacity of the sample. The thermal diffusivity was determined by the AC calorimetric process, after the sample was processed into a test piece of 5 mm width×30 mm×0.4 mm thickness. The analyzer used was an AC-calorimetric-method thermal diffusivity analyzer (LaserPit, produced by Ulvac-Riko, Inc.) The specific gravity and the specific heat capacity were those determined in measurement of the heat conductivity in the thickness direction. The heat conductivity in the in-plane direction should be 2.0 (W/mK) or more.

(Insulation Reliability)

<Initial Dielectric Strength>

A substrate material having a thickness of 0.5 mm was laminated on an aluminum plate having a thickness of 1.5 mm and a copper foil having a thickness of 0.1 mm was laminated on the substrate material. After lamination, the composite was placed in an environment at 150° C. for 2.0 hours for completion of curing, to give a substrate. The periphery of the copper foil on the substrate was etched, leaving a circular region having a diameter of 20 mm. The substrate was then immersed in an electrical insulating oil; AC voltage was applied between the copper foil and the aluminum plate at room temperature; and the initial dielectric strength was determined in accordance with JIS C2110. The analytical instrument used was TOS-8700, produced by Kikusui Electronics Corp. The initial dielectric strength should be 20 (kV/mm) or more.

Examples 2 to 11

Examples 2 to 11 were similar to Example 1, except the changes shown in "Table 1."

The following compounds were used in the compositions shown in "Table 1":

Al$_2$O$_3$ of Example 7: spherical aluminum oxide (ASFP-20, produced by Denki Kagaku Kogyo Kabushiki Kaisha) containing particles having a particle diameter of 3.0 μm or less in an amount of 90 vol % and having an average particle diameter of 0.5 μm.

Coarse particles of inorganic filler BN shown as "Aggregate" of Examples 8 and 9: PT670, produced by Momentive Performance Materials Inc., having an average particle diameter of 300 μm, a tap density of 1.0 g/cm$^3$, and a GI value of 1.1

Curing resin naphthalenetetracarboxylic dianhydride of Example 10: NTCDA, produced by JFE Chemical Corporation Curing resin naphthol aralkyl-type phenol resin of Example 11: SN-485, produced by Tohto Kasei Co., Ltd.

Examples 12 to 15

In Examples 12 to 15, cured resins, molded objects, substrate laminate materials, and circuit boards were prepared at a blending amount and by an operation similar to those of Examples 1 to 4, except that the laminate substrate material (d) prepared in the thin plate shape from the resin composition of Example 1 in an extrusion molding machine was used as it was.

The orientation degrees of the inorganic particles in the substrate materials of Examples 12 to 15 were determined to be 0.01 or less, indicating that the particles were favorably oriented in the in-plane direction. As a result, the heat conductivity in the in-plane direction was higher and thus, the temperature of the entire substrate was more uniform than the substrate of Example 1. When the temperature of the substrate is uniform, the temperature over an electronic device containing the substrate is also uniform and its operation stabilized.

TABLE 2

| Composition and evaluation/ | Example | | | | | | Comparative Example | | | | |
|---|---|---|---|---|---|---|---|---|---|---|---|
| Example/Comparative Example | 12 | 13 | 14 | 15 | 16 | 17 | 1 | 2 | 3 | 4 | 5 |
| Resin composition | | | | | | | | | | | |
| Epoxy resin (parts by mass) | | | | | | | | | | | |
| Naphthalene type | 31.7 | 16.7 | 10.5 | 8.8 | 8.8 | 10.5 | — | — | — | — | 7.7 |
| Alicyclic bisphenol A-type | — | — | — | — | — | — | 13.5 | — | 6.25 | 6.25 | — |
| Hydrogenated bisphenol A-type | — | — | — | — | — | — | — | 13.5 | — | — | — |
| Biphenyl-type | — | — | — | — | — | — | — | — | 6.25 | — | — |
| Triazine-type | — | — | — | — | — | — | — | — | — | 6.25 | — |
| Curing agent (parts by mass) | | | | | | | | | | | |
| Imidazoles | 2.70 | 1.60 | 1.00 | 0.90 | 0.90 | 1.00 | 1.35 | 1.35 | 1.35 | 1.35 | 1.00 |
| Inorganic filler | | | | | | | | | | | |
| Coarse particles | | | | | | | | | | | |
| Material | BN | BN | BN | BN | BN | BN | BN | BN | BN | BN | $Al_2O_3$ |
| Shape | flat plate | flat plate | flat plate | flat plate | flat plate | flat plate | flat plate | flat plate | flat plate | flat plate | spherical |
| Tap density (g/cm$^3$) | 0.8 | 0.8 | 0.8 | 0.8 | 0.2 | 0.8 | 0.8 | 0.8 | 0.8 | 0.8 | — |
| GI value | 0.6 | 0.6 | 0.6 | 0.6 | 1.55 | 0.6 | 0.6 | 0.6 | 0.6 | 0.6 | — |
| Average diameter (μm) | 23 | 23 | 23 | 23 | 5 | 23 | 23 | 23 | 23 | 23 | 10 |
| Blending amount (parts by mass) | 55.9 | 69.6 | 75.31 | 76.9 | 76.9 | 53 | 72.5 | 72.5 | 72.5 | 72.5 | 75.31 |
| Fine particles | | | | | | | | | | | |
| Material | BN | BN | BN | BN | BN | BN | BN | BN | BN | BN | BN |
| Shape | flat plate | flat plate | flat plate | flat plate | flat plate | flat plate | flat plate | flat plate | flat plate | flat plate | flat plate |
| Average diameter (μm) | 2.2 | 2.2 | 2.2 | 2.2 | 2.2 | 2.2 | 2.2 | 2.2 | 2.2 | 2.2 | 2.2 |
| Blending amount (parts by mass) | 9.8 | 12.1 | 13.1 | 13.4 | 13.4 | 35.4 | 12.7 | 12.7 | 12.7 | 12.7 | 13.1 |
| Filling rate (vol %) | 50 | 70 | 80 | 83 | 80 | 80 | 75 | 75 | 75 | 75 | 80 |
| Coarse particles ratio (%) | 85 | 85 | 85 | 85 | 85 | 60 | 85 | 85 | 85 | 85 | 85 |
| Curing catalyst (parts by mass) | 1.8 | 1.8 | 1.9 | 2.0 | 0.9 | 1 | 1.35 | 1.35 | 1.35 | 1.35 | 1 |
| Coupling agent (parts by mass) | 0.5 | 0.5 | 0.5 | 0.5 | 0.5 | 0.5 | 0.5 | 0.5 | 0.5 | 0.5 | 0.5 |
| Evaluation | | | | | | | | | | | |
| Heat resistance (° C.) | 406 | 421 | 435 | 440 | 434 | 435 | 423 | 305 | 412 | 435 | 432 |
| Heat conductivity (W/Mk) | | | | | | | | | | | |
| Thickness direction | 2.9 | 3.0 | 3.2 | 3.4 | 15.0 | 14.7 | 8.1 | 8.2 | 9.7 | 10.0 | 7.8 |
| In-plane direction | 10.4 | 22.1 | 38.2 | 42.1 | 2.1 | 2.0 | 1.7 | 2.2 | 2.4 | 2.2 | 1.8 |
| Thermal diffusivity (m$^2$/sec) | 1.8 | 1.8 | 1.9 | 2.0 | 9.0 | 9.1 | 5.2 | 5.1 | 6.2 | 6.3 | 6.2 |
| Specific gravity (kg/m$^3$) | 1.71 | 1.92 | 2.03 | 2.04 | 1.92 | 1.82 | 1.76 | 1.79 | 1.75 | 1.80 | 3.04 |
| Specific heat (J/kgK) | 0.96 | 0.88 | 0.84 | 0.84 | 0.87 | 0.89 | 0.89 | 0.9 | 0.89 | 0.88 | 0.81 |
| Initial dielectric strength (kV/mm) | 75 | 69 | 61 | 55 | 30.0 | 20.0 | 24.0 | 20.0 | 15.0 | 14.0 | 32.0 |

Example 16

Example 16 is identical with Example 1, except that the flat plate-shaped hexagonal boron nitride used as coarse particles of the inorganic filler were HP-P4, produced by Mizushima Tekkosho Co., Ltd. (average particle diameter: 5 μm, tap density: 02 g/cm$^3$, GI value: 1.55).

Example 17

Example 17 is identical with Example 1, except that the blending ratio of the coarse and fine particles of the inorganic filler was changed, as shown in "Table 2."

Comparative Examples 1 to 4

Comparative Examples 1 to 4 were identical with Example 1, except the change shown in "Table 2." The following compounds were used in the compositions shown in "Table 2":
Alicyclic bisphenol A-type epoxy resin: ST-300, produced by Tohto Kasei Co., Ltd.
Biphenyl-type epoxy resin: YX4000H, produced by Japan Epoxy Resins Co., Ltd.
Triazine-type triepoxy resin among epoxy resins: TEPIC-PAS, produced by Nissan Chemical Industries, Ltd.

Comparative Example 5

Comparative Example 5 is identical with Example 1, except that the spherical aluminum oxide used as the coarse particles of the inorganic filler was DAW10, produced by Denki Kagaku Kogyo Kabushiki Kaisha (average particle diameter: 10 μm) and there were the changes shown in "Table 2."

As a result, the resin compositions obtained in Comparative Examples were unsatisfactory in at least one of heat resistance, heat conductivity, and initial dielectric strength.

The invention claimed is:

1. A resin composition comprising an epoxy resin, a curing agent and an inorganic filler, wherein: one or both of the epoxy resin and the curing agent contain a naphthalene structure; the inorganic filler contains hexagonal boron nitride; and the inorganic filler is contained in an amount of 50 to 85 vol % in the entire resin composition wherein the inorganic filler contains coarse particles having an average particle diameter of 10 to 400 μm and fine particles having an average particle diameter of 0.5 to 4.0 μm, and the blending ratio of the coarse particles is 70% or more.

2. The resin composition according to claim 1, wherein the coarse particles are particles of hexagonal boron nitride.

3. The resin composition according to claim 1, wherein the fine particles are particles of hexagonal boron nitride.

4. The resin composition according to claim 1, wherein: the coarse particles are particles of hexagonal boron nitride having a graphitization index (GI) value of 1.5 or less; the shape of the coarse particles is individual flat plate or the aggregate of flat plate-shaped particles; and the coarse particles have a tap density of 0.5 g/cm$^3$ or more.

5. The resin composition according to claim 1, wherein the fine particles are spherical particles of aluminum oxide.

6. A molded object prepared by molding and curing a resin composition comprising an epoxy resin, a curing agent, and an inorganic filler, wherein one or both of the epoxy resin and the curing agent contain a naphthalene structure, the inorganic filler contains hexagonal boron nitride, and the inorganic filler is contained in an amount of 50 to 85 vol % in the entire resin composition, wherein the inorganic filler contains coarse particles having an average particle diameter of 10 to 400 μm and fine particles having an average particle diameter of 0.5 to 4.0 μm, and the blending ratio of the coarse particles is 70% or more.

7. The molded object according to claim 6, wherein the coarse particles are particles of hexagonal boron nitride.

8. The molded object according to claim 6, wherein the fine particles are particles of hexagonal boron nitride.

9. The molded object according to claim 6, wherein: the coarse particles are particles of hexagonal boron nitride having a graphitization index (GI) value of 1.5 or less; the shape of the coarse particles is individual flat plate or the aggregate of flat plate-shaped particles; and the coarse particles have a tap density of 0.5 g/cm$^3$ or more.

10. The molded object according to claim 6, wherein the fine particles are spherical particles of aluminum oxide.

11. A substrate material prepared by molding a resin composition comprising an epoxy resin, a curing agent, and an inorganic filler, wherein one or both of the epoxy resin and the curing agent contain a naphthalene structure, the inorganic filler contains hexagonal boron nitride, and the inorganic filler is contained in an amount of 50 to 85 vol % in the entire resin composition, into a sheet shape and converting the resulting sheet into the B stage state under heat, wherein the inorganic filler contains coarse particles having an average particle diameter of 10 to 400 μm and fine particles having an average particle diameter of 0.5 to 4.0 μm, and the blending ratio of the coarse particles is 70% or more.

12. The substrate material according to claim 11, wherein: the coarse particles are particles of hexagonal boron nitride having a graphitization index (GI) value of 1.5 or less; the shape of the coarse particles is individual flat plate or the aggregate of flat plate-shaped particles; and the coarse particles have a tap density of 0.5 g/cm$^3$ or more.

13. The substrate material having a flattened cut-terminal face, obtained by laminating multiple substrate materials according to claim 11 above and cutting the laminate in the thickness direction.

14. The substrate material according to claim 11, wherein the inorganic filler is oriented in a certain direction.

* * * * *